United States Patent [19]

Kamon

[11] Patent Number: 5,422,206
[45] Date of Patent: Jun. 6, 1995

[54] PHOTOMASK AND METHOD OF MANUFACTURING THE SAME

[75] Inventor: Kazuya Kamon, Itami, Japan

[73] Assignee: Mitsubishi Denki Kabushiki Kaisha, Tokyo, Japan

[21] Appl. No.: 218,847

[22] Filed: Mar. 28, 1994

Related U.S. Application Data

[63] Continuation of Ser. No. 884,173, May 18, 1992, abandoned.

[30] Foreign Application Priority Data

May 24, 1991 [JP] Japan ................... 3-119933

[51] Int. Cl.$^6$ ............................... G03F 9/00
[52] U.S. Cl. ........................ 430/5; 430/311; 430/320
[58] Field of Search ................ 430/5, 320, 311

[56] References Cited

U.S. PATENT DOCUMENTS 4,178,403 12/1979 Sakurai et al. ............... 428/209
4,411,972 10/1983 Narken et al. .................. 430/5
4,720,442 1/1988 Shinkai et al. .................. 430/5

FOREIGN PATENT DOCUMENTS 62-297850 12/1987 Japan .
63-204259 8/1988 Japan .

Primary Examiner—Mark A. Chapman
Attorney, Agent, or Firm—Oblon, Spivak, McClelland, Maier, & Neustadt

[57] ABSTRACT

A first anti-reflection film is inserted between a transparent glass substrate and the light shielding pattern. The first anti-reflection film has a refractive index larger than that of the glass substrate but smaller than that of the light shielding pattern. A second anti-reflection film is formed on the glass substrate between adjacent light shielding patterns. The second anti-reflection film has a refractive index larger than that of air but smaller than that of the glass substrate. Thus, a light beam entering the glass substrate is not reflected at the front surface of the glass substrate regardless of whether the light beam entered in a portion provided with a light shielding pattern.

12 Claims, 6 Drawing Sheets

PHOTOMASK AND METHOD OF MANUFACTURING THE SAME

This application is a continuation of application Ser. No. 07/884,173, filed on May 5, 1992, now abandoned.

BACKGROUND OF THE INVENTION

1. Field of the Invention

The present invention is directed to a photomask used in photolithography process in fabricating an LSI device and a method of manufacturing the same.

2. Description of the Background Art

A photomask disclosed in Japanese Patent Application Laid-Open Gazette No. 62-66444 can be cited as an example of a conventional photomask. As shown in FIG. 1, the conventional photomask comprises a glass substrate 50, an anti-reflection film 51 and a light shielding pattern 52, the front surface of the glass substrate 50 being covered with an anti-reflection film 51, the light shielding pattern 52 being formed on the surface of the anti-reflection film 51. The anti-reflection film 51 has a minimum reflectance ratio when its refractive index $n_a$ and its thickness $d_a$ are:

$$n_a \cdot d_a = \lambda/4 \tag{1}$$

The minimum reflectance ratio of the anti-reflection film 51 becomes zero when:

$$n_a^2 = n_{air} n_g \tag{2}$$

where $n_g$ is the refractive index of the glass material of the glass substrate 50 and $n_{air}$ is the refractive index of air.

FIG. 3 is a diagram of an optical system for printing a circuit pattern on a wafer W by using such a conventional photomask P'. In FIG. 3, a light source is labelled G and lenses are labelled $L_1$ and $L_2$.

The conventional photomask P' has a problem as explained in the description below. For convenience of understandings, the description below is on the premise that the film thickness of the anti-reflection film 51 fully satisfies Eq. 1.

First, explanation is given on where the refractive index of the anti-reflection film 51 is smaller than that of the glass substrate 50, and not to mention, smaller than that of the light shielding pattern 52. In this case, a light beam incident upon the photomask P' advances as shown in FIG. 2A. More precisely, an incident light beam A' entering the glass substrate 50 from the back surface side is partially reflected at an interface 53 between the glass substrate 50 and the anti-reflection film 51 and becomes a reflected light beam B'. Since the refractive index of the anti-reflection film 51 is smaller than that of the glass substrate 50, the reflection at the interface 53 does not cause phase shift. An incident light beam A' entering the anti-reflection film 51 is reflected at an interface 54 between the anti-reflection film 51 and air and becomes a reflected light beam C' or reflected at an interface 55 between the anti-reflection film 51 and the light shielding pattern 52 and becomes a reflected light beam D'. Again, phase shift does not occur at the interface 54 because the refractive index of the anti-reflection film 51 is larger than that of air (See the imaginary lines of FIGS. 2A and 2B). On the other hand, the refractive index of the anti-reflection film 51 is generally smaller than that of the light shielding pattern 52. Hence, where $\lambda$ is a wavelength as a light beam has in air, a light beam reflected at the interface 55 is $\lambda/2$ out of phase from the incident light beam A'. As mentioned earlier, the thickness of the anti-reflection film 51 is so determined that Eq. 1 is satisfied. Hence, when a light beam enters the anti-reflection film 51 and is reflected at the interface 54 or the interface 55, the phase of the reflected light beam is led by $\lambda/2$ in terms of an optical path length within the anti-reflection film 51. As a result, once the reflected light beams B' and C', which are not phase shifted when reflected, have entered the glass substrate 50, they have reversed phases shifted by $\lambda/2$. Due to the reverse phases, the reflected light beams B' and C' cancel each other, whereby reflected light beams advancing within the glass substrate 50 are restrained. On the contrary, since the reflected light beam D' is phase shifted by $\lambda/2$ when reflected, the reflected light beams B' and D' have same phases in the glass substrate 50, hence intensifying each other. As a result, intensified strong reflected light beams pass through the glass substrate 50. More particularly, when a light beam is reflected at the light shielding pattern 52, the reflected light beam advances within the glass substrate 50 as intensified light beam. Such a reflected light beam with a strengthened intensity is problematic. Chances are that the reflected light beam is reflected once again at the interface 56 between the back surface of the glass substrate 50 and air, and goes out of the glass substrate 50 from a region between adjacent light shielding patterns 52. The reflected light beam allowed to the outside of the glass substrate 50 in such a manner is a stray light beam, which deteriorates a printed pattern.

Now, description is directed to where the anti-reflection film 51 is made of material which has a refractive index smaller than that of the light shielding pattern 52 but larger than that of the glass substrate 50. In this case, propagation of light beams is as shown in FIG. 2B. Unlike the case shown in FIG. 2A, an incident light beam A' is partially reflected at the interface 53 between the glass substrate 50 and the anti-reflection film 51 while phase shifted by $\lambda/2$ and becomes a reflected light beam E'. At the interface 54 between the anti-reflection film 51 and air, the incident light beam A' is reflected without being phase shifted and becomes a reflected light beam F'. At the interface 55 between the anti-reflection film 51 and the light shielding pattern 52, the incident light beam A' is reflected while being phase shifted by $\lambda/2$ and becomes a reflected light beam G'. Since the thickness of the anti-reflection film 51 is so determined that Eq. 1 is satisfied, the reflected light beams E' and G', which are phase shifted by $\lambda/2$ from the incident light beam A' when reflected, have reversed phases shifted by $\lambda/2$ from each other so that they cancel each other within the glass substrate 50'. However, since the reflected light beam F' is not phase shifted when reflected, the reflected light beams E' and F' have same phases and intensify each other within the glass substrate 50. Thus, stray light beams result similarly to the case of FIG. 2A, and cause deterioration in a printed pattern on a wafer.

The present invention has been made to solve such problems. The object of the present invention is therefore to offer a photomask which restrains reflected light beams with an increased effect thereby to prevent deterioration in a printed pattern on a wafer. To offer a method of manufacturing such photomask is also what the present invention intends to achieve.

SUMMARY OF THE INVENTION

According to the present invention, a photomask is formed by a transparent substrate and a light shielding pattern provided on a front surface side of said transparent substrate, and comprises: a first anti-reflection film formed between said transparent substrate and the light shielding pattern; a second anti-reflection film formed on the front surface of the transparent substrate. The photomask is characterized in that a thickness of the first anti-reflection film is so determined that a phase of a first light beam and a phase of a second light beam are phase shifted by half the wavelength of the first and second light beams at a back surface of the first anti-reflection film, the first light beam being a light beam entering the first anti-reflection film from the back surface thereof and reflected at an interface between the first anti-reflection film and the light shielding pattern back toward the back surface of the first anti-reflection film and the second light beam being a light beam reflected at the back surface of the first anti-reflection film without entering the first anti-reflection film; and that a thickness of the second anti-reflection film is so determined that a phase of a third light beam and a phase of a fourth light beam are phase shifted by half wavelength of the third and fourth light beams at the back surface of the second anti-reflection film, the third light beam being a light beam entering the second anti-reflection film from the back surface thereof and hitting the back surface of the second anti-reflection film once again by reflected at a front surface of the second anti-reflection film and the fourth light beam being a light beam reflected at the back surface of the second anti-reflection film without entering the second anti-reflection film.

Preferably, the photomask further comprises a third anti-reflection film formed on the front surface of the light shielding pattern, characterized in that a thickness of the third anti-reflection film is so determined that a phase of a fifth light beam and a phase of a sixth light beam are phase shifted by half wavelength of the fifth and sixth light beams at the front surface of the third anti-reflection film, the fifth light beam being a light beam entering the third anti-reflection film from a front surface thereof and reflected at an interface between the third anti-reflection film and the light shielding pattern back toward the front surface of the third anti-reflection film and the sixth light beam being a light beam reflected at the front surface of the third anti-reflection film without entering the third anti-reflection film.

Preferably, the second anti-reflection film and the third anti-reflection film are made of same material.

In another preferred aspect, the photomask further comprises a fourth anti-reflection film formed on the back surface of the transparent substrate, a thickness of the fourth anti-reflection film being so determined that a phase of a seventh light beam and a phase of a eighth light beam are phase shifted by half a wavelength of the seventh and eighth light beams at the back surface of the fourth anti-reflection film, the seventh light beam being a light beam entering the fourth anti-reflection film from a back surface thereof and reflected at an interface between the fourth anti-reflection film and the transparent substrate back toward the back surface of the fourth anti-reflection film and the eighth light beam being a light beam reflected at the back surface of the fourth anti-reflection film without entering the fourth anti,reflection film.

In still another preferred aspect, the first anti-reflection film has a two-layered structure and one of the two layers of the first anti-reflection film is integrated with the second anti-reflection film.

In still another preferred aspect, a refractive index of the first anti-reflection film is in between a refractive index of the transparent substrate and a refractive index of the light shielding pattern and the thickness $d_a$ of the first anti-reflection film is expressed as:

$$n_a \cdot d_a = \lambda/4$$

where $n_a$ is the refractive index of the first anti-reflection film and $\lambda$ is a wavelength of a light beams in air.

In the photomask according to the present invention, a light beam entering the transparent substrate from the back surface side of the transparent substrate advances toward the back surface of the first anti-reflection film or the back surface of the second anti-reflection film. The first light beam entering the first anti-reflection film is reflected at the front surface of the first anti-reflection film while the third light beam entering the second anti-reflection film is partially reflected at the front surface of the second anti-reflection film. The first light beam which entered the first anti-reflection film and was reflected at the front surface of the first anti-reflection film is phase shifted, at the back surface of the first anti-reflection film, by half the wavelength of the light beams from the second light beam reflected at the back surface of the first anti-reflection film without entering the same. As a result, the first and the second light beams cancel each other at the back surface of the first anti-reflection film. On the other hand, the third light beam, which was entered the the second anti-reflection film and was reflected at the front surface thereof is phase shifted, at the back surface of the second anti-reflection film, by half the wavelength of the light beams from the fourth light beam reflected at the back surface of the second anti-reflection film without entering the same. Consequently, the third and the fourth light beams cancel each other at the back surface of the second anti-reflection film.

Thus, a light beam entering the transparent substrate is restrained from being reflected at the front surface of the transparent substrate regardless of whether the light beam entered at a portion provided with a light shielding pattern. Hence, the photomask of the present invention effectively prevents stray light which causes deterioration in a pattern printed on a wafer.

The present invention is also directed to a method of manufacturing a photomask. According to an aspect of the present invention, the manufacturing method comprises the steps of forming a first anti-reflection film material layer on a front surface of a transparent substrate; forming a light shielding material layer on a front surface of the first anti-reflection film material layer; selectively etching the first anti-reflection film material layer and the light shielding material layer corresponding to a desired light shielding pattern; and forming a second anti-reflection film on the front surface of said transparent substrate exposed by the etching and forming a third anti-reflection film on a front surface of the light shielding pattern.

Preferably, in the manufacturing method, the light shielding material layer is made of chromium and the first anti-reflection film material layer is made of chromium oxide.

Preferably, the manufacturing method further comprises a step of forming a fourth anti-reflection film on a back surface of the transparent substrate after the etching.

According to the manufacturing method, it is possible to separately form the first anti-reflection film, which is to be disposed between the light shielding pattern and the transparent substrate, and the second anti-reflection film, which is to be disposed on the front surface of the transparent substrate in a portion not provided with the light shielding pattern. Hence, the first and the second anti-reflection films have reflection prevention effects by separately determining the refractive indexes and the thicknesses of the first and the second anti-reflection films.

A method of manufacturing a photomask according to another aspect of the present invention comprises the steps of forming a first anti-reflection film material layer on a front surface of a transparent substrate; forming a second anti-reflection film material layer on a front surface of the first anti-reflection film material layer; forming a light shielding material layer on a front surface of the second anti-reflection material layer; forming a third anti-reflection film material layer on a front surface of the light shielding material layer; and selectively etching the third anti-reflection film material layer, the light shielding material layer and the second anti-reflection film material layer corresponding to a desired light shielding pattern.

Preferably, the light shielding material layer is made of chromium, the second and third anti-reflection film material layers are made of chromium oxide and the first anti-reflection film material layer is made of magnesium difluoride.

Preferably, the manufacturing method further comprises a step of forming a fourth anti-reflection film on the back surface of the transparent substrate.

In the manufacturing method according to the another aspect of the present invention, a first anti-reflection film consists of the first anti-reflection film material layer and the second anti-reflection film material layer, and a second anti-reflection film consists of the second anti-reflection film material layer only. Hence, it is possible to separately determine the thickness of the first anti-reflection film and the thickness of the second anti-reflection, which provides that light beams entering the transparent substrate from being any surface are prevented from reflected.

Accordingly, the object of the present invention is to offer a photomask which restrains reflected light beams with an increased effect thereby to prevent deterioration in a printed pattern on a wafer. Another object of the present invention is to offer a method of manufacturing such photomask.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
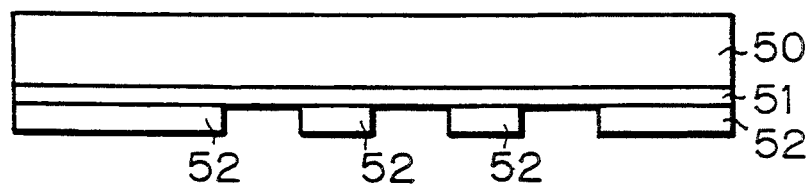
FIG. 1 is a cross sectional view of a conventional photomask.
Figure 3:
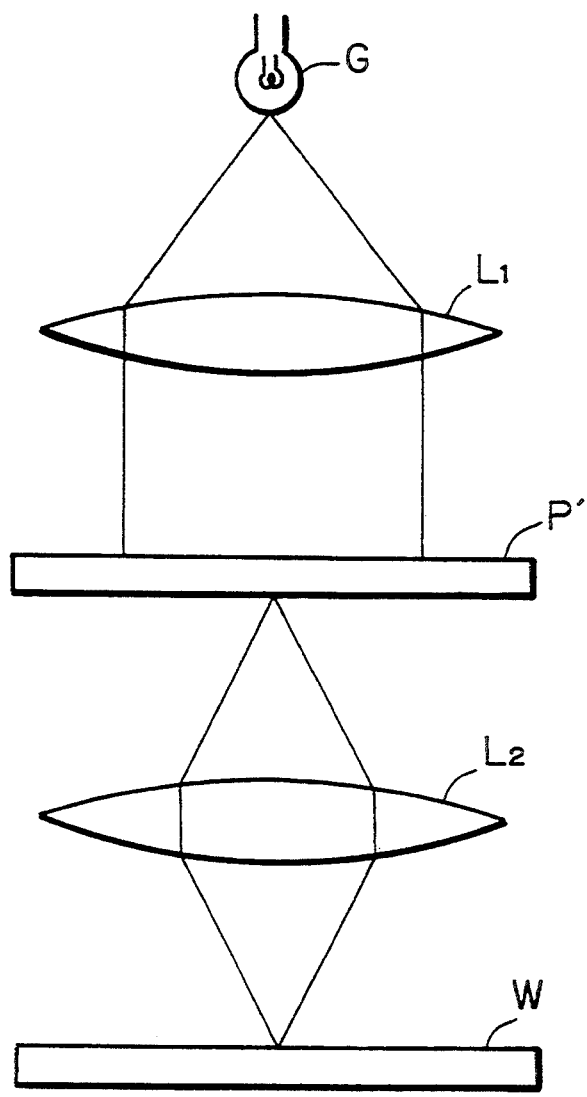
FIG. 3 is a diagram of an optical system for printing a circuit pattern on a wafer by using the conventional photomask.
Figure 2A:
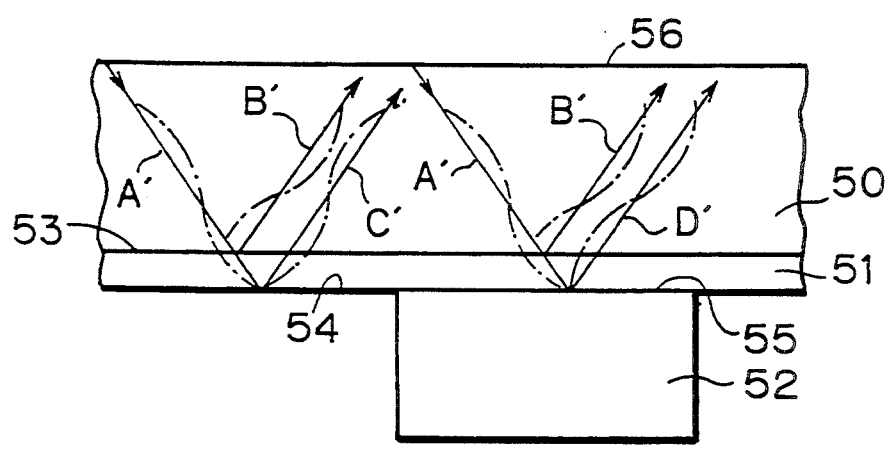
FIGS. 2A and 2B are explanatory diagrams explaining how light beams are reflected in the conventional photomask.
Figure 2B:
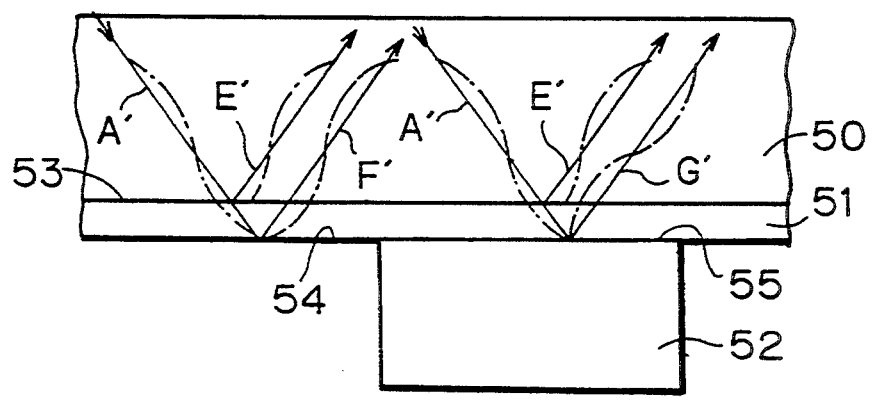
Figure 4:
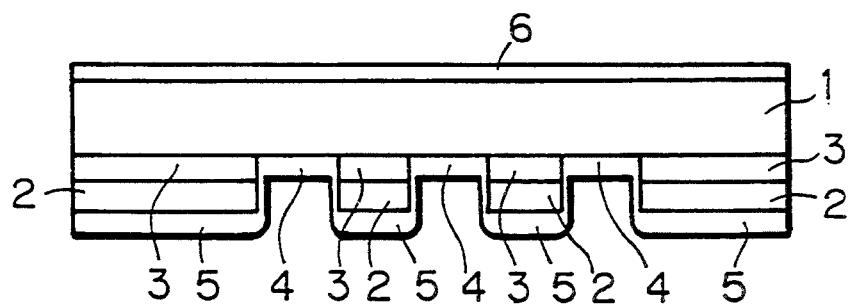
FIG. 4 is a cross sectional view of a photomask according to a first embodiment of the present invention.

FIG. 4 shows a photomask according to a first embodiment of the present invention. The photomask comprises a chromium light shielding pattern 2 formed on a front surface of a transparent glass substrate 1.

Between the glass substrate 1 and the light shielding pattern 2, a first anti-reflection film 3 is inserted. The first anti-reflection film 3 is made of transparent material which has a refractive index larger than that of the glass substrate 1 but smaller than that of the light shielding pattern 2, e.g., chromium oxide.

A second anti-reflection film 4 is formed on the front surface of the glass substrate 1 between adjacent light shielding patterns 2. The second anti-reflection film 4 is made of transparent material which has a refractive index smaller than that of the glass substrate 1, e.g., magnesium difluoride.

On the surface of the light shielding pattern 2, a third anti-reflection film 5 is disposed. The third anti-reflection 5 is made of transparent material which has a reflective index smaller than that of the light shielding pattern 2. In the first embodiment, the third anti-reflection film 5 is made of the same material as that of the second anti-reflection film 4.

The glass substrate 1 is covered on its back surface with a fourth anti-reflection film 6. Similarly to the second anti-reflection film 4, the anti-reflection film 6 is made of transparent material such as magnesium difluoride which has a refractive index smaller than that of the glass substrate 1.

The thicknesses of the first to the fourth anti-reflection films 3–6 are so determined that Eq. 1 is satisfied, that is, $\lambda/4$ in terms of an optical path length where $\lambda$ is a wavelength of a light beam as propagating in air.

The photomask of FIG. 4 restrains a stray light beam in the manner as described below. For precise understandings, it is important to note that the first embodiment requires the materials of the photomask as follows: first anti-reflection film 3 is made of chromium oxide with a refractive index of about 1.6; the second to the fourth anti-reflection films 4–6 are made of magnesium difluoride which has a refractive index of about 1.4; the glass material of the glass substrate 1 has a refractive index of 1.46; and the light shielding pattern 2 is made of chromium which has a refractive index of 3.8.

When an incident light beam illuminated from the back surface side of the photomask is reflected at the back surface of the glass substrate 1, the reflection is restrained by the fourth anti-reflection film 6. When an incident light beam entering the glass substrate 1 from the back surface side of the photomask is reflected at the front surface of the glass substrate 1, the reflection is restrained by the first or the second anti-reflection film 3 or 4. Reflection of an incident light beam from the front surface side of the photomask at the front surface of the glass substrate 1 is restrained by the second anti-reflection film 4. Reflection of an incident light beam from the front surface side of the photomask at the front surface of the light shielding pattern 2 is restrained by the third anti-reflection film 5.

Figure 5:
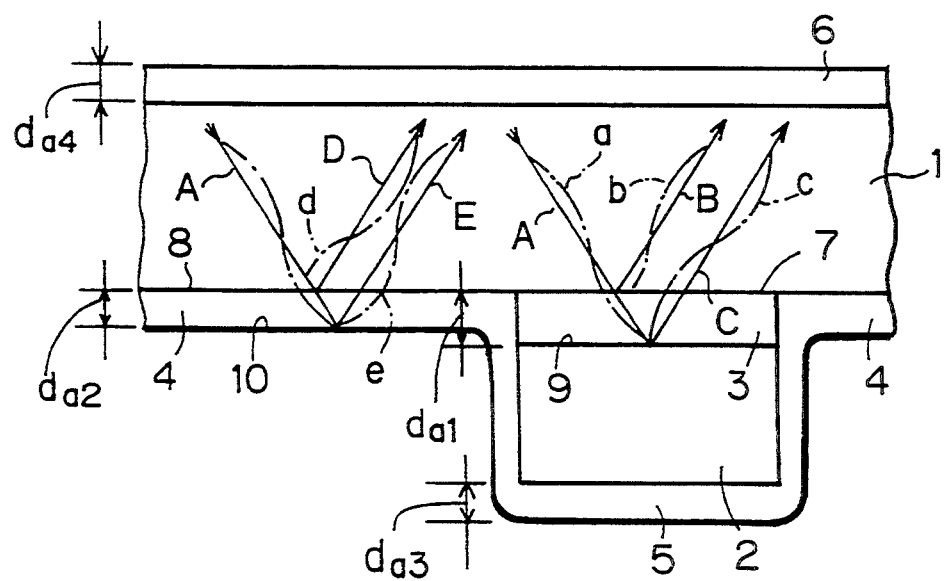
FIG. 5 is a cross sectional view showing how light beams are reflected in the photomask of FIG. 4.

Now, a detailed description is made on how a light beam A entering the glass substrate 1 from the back surface side of the photomask is reflected at the front surface thereof, while referring to FIG. 5.

The incident light beam A is partially reflected at an interface 7 between the glass substrate 1 and the first anti-reflection film 3 or at an interface 8 between the glass substrate 1 and the second anti-reflection film 4.

The incident light beam A entering the first anti-reflection film 3 is reflected at an interface 9 between the first anti-reflection film 3 and the light shielding pattern 2. On the other hand, the incident light beam A entering the second anti-reflection film 4 is partially reflected at an interface 10 between the second anti-reflection film 4 and air, that is, the front surface of the second anti-reflection film 4.

As mentioned above, the refractive index $n_g$ of the glass substrate 1 is 1.46 and the refractive index $n_{a1}$ of the first anti-reflection film 3 is 1.6. Thus, the glass substrate 1 has a smaller refractive index than the first anti-reflection film 3. Hence, as shown with imaginary lines in FIG. 5, a reflected light beam B reflected at the interface 7 has a waveform b which is phase shifted by $(\lambda/n_g)/2$, or $\lambda/2$ in terms of an optical path length from a waveform a of the incident light beam A. On the other hand, the incident light beam A entering the first anti-reflection film 3 from the glass substrate 1 is reflected at an interface 9. Since the refractive index of 3.8 of the light shielding pattern 2 is larger than that of the first anti-reflection film 3, a reflected light beam C reflected at the interface 9 has a waveform c is which is phase shifted by $(\lambda/n_a)/2$, or $\lambda/2$ in terms of an optical path length from a waveform a of the incident light beam A. However, when the thickness $d_{a1}$ of the first anti-reflection film 3 is so determined that Eq. 3 below holds, $$n_{a1} \cdot d_{a1} = \lambda/4 \tag{3}$$

a light beam entering the first anti-reflection film 3 and reflected at the interface 9 propagates within the first anti-reflection film 3 with a phase led by $\lambda/2$ in terms of an optical path length. Hence, the reflected light beam B reflected at the interface 7 and the light beam C re-entering the glass substrate 1 after reflected at the interface 9 have phases shifted by $\lambda/2$ from each other within the glass substrate 1. Thus, the reflected light beams B and C cancel each other, whereby reflection at the front surface of the glass substrate 1 in a region provided with the first anti-reflection film 3 is restrained.

The refractive index $n_{a2}$ of the second anti-reflection film 4 is 1.4, and thus, smaller than the refractive index $n_g$ of the glass substrate 1. Hence, as shown with imaginary lines in FIG. 5, a reflected light beam D reflected at the interface 8 has a waveform d which is not phase shifted from the waveform a of the incident light beam A. The incident light beam A entering the second anti-reflection film 4 from the glass substrate 1 is partially reflected at an interface 10. Since the refraction index $n_{air}$ of air is 1, needless to say smaller than the refraction index $n_{a2}$ of the second anti-reflection film 4, a reflected light beam E reflected at the interface 10 has a waveform e which is not phase shifted from the waveform a of the incident light beam A. However, when the thickness $d_{a2}$ of the second anti-reflection film 4 is so determined that Eq. 4 below holds, $$n_{a2} \cdot d_{a2} = \lambda/4 \tag{4}$$

a light beam entering the second anti-reflection film 4 and reflected at the interface 10 advances within the second anti-reflection film 4 is phase led by $\lambda/2$ in terms of an optical path length. Hence, within the glass substrate 1, the reflected light beam D reflected at the interface 8 and the light beam E re-entering the glass substrate 1 after being reflected at the interface 10 have phases shifted by $\lambda/2$ from one another. Thus, the reflected light beams D and E cancel each other, whereby reflection at the front surface of the glass substrate 1 in a region provided with the second anti-reflection film 4 is restrained.

As heretofore described, when a light beam enters the glass substrate 1, reflection at the front surface of the glass substrate 1 is well restrained, which would effectively prevent deterioration of a wafer because of a stray light beam. Stray light prevention according to the present invention is not encompassed to the description heretofore.

That is, the photomask according to the first embodiment promises furthermore stray light prevention by means of the third anti-reflection film 5 provided on the surface of the light shielding pattern 2 and the fourth anti-reflection film 6 provided on the back surface of the glass substrate 1. The details are as described below.

The third anti-reflection film 5 restrains reflection of a light beam advancing toward the light shielding pattern 2. A light beam advancing toward the light shielding pattern 2 first hit the surface of the third anti-reflection film 5 and is partially reflected thereat while an unreflected portion of the light beam is partially reflected at the surface of the light shielding pattern 2. Neither the reflection at the surface of the third anti-reflection film 5 nor the reflection at the surface of the light shielding pattern 2 accompany phase shift. The thickness $d_{a3}$ of the third anti-reflection film 5 is equal to the thickness $d_{a2}$ of the second anti-reflection film 4. Hence, the reflected light beam reflected at the surface of the third anti-reflection film 5 weakens the reflected light beam reflected at the surface of the light shielding pattern 2.

The thickness $d_{a4}$ of the fourth anti-reflection film 6 is equal to the thickness $d_{a2}$ of the second anti-reflection film 4. The fourth anti-reflection film 6 restrains reflection of a light beam toward the glass substrate 1 from the back surface side as well as reflection of a light beam passing through the glass substrate 1 toward the back surface of the glass substrate 1. A light beam toward the glass substrate 1 from the back surface side is reflected at the surface of the fourth anti-reflection film 6 or at the interface between the fourth anti-reflection film 6 and the glass substrate 1 without being phase shifted. As a result, the reflection is restrained. On the other hand, a light beam passing through the glass substrate 1 toward the back surface of the glass substrate 1 is reflected at the interface between the fourth anti-reflection film 6 and the glass substrate 1 or at the surface of the fourth anti-reflection film 6 while phase shifted by λ/2 in terms of an optical path length. Likewise, the reflection is restrained.

As described above, the photomask according to the first embodiment successfully restrains all reflection light beams reflected at the front surface thereof as well as reflected light beams generated by the light shielding pattern 2 in a boundary portion between the glass substrate 1 and the light shielding pattern 2. Thus, stray light, which is a cause of deterioration of a wafer, is effectively restrained.

The first embodiment requires that the thicknesses of all the anti-reflection films are so determined that Eq. 1 is satisfied in order to minimize the thickness of each anti-reflection film. However, when relations between the refractive index of the glass substrate 1 and those of the first, the second and the fourth anti-reflection films 3, 4 and 6 are the same as they are in the first embodiment, the refractive indexes of the anti-reflection films 3, 4 and 6 each may be determined such that the film thickness $d_{an}$ (n=1, 2, or 4) of each anti-reflection film satisfies Eq. 5 below:

$$n_{an} \cdot d_{an} = (2k-1) \cdot \lambda/4 \qquad (5)$$

where $n_{an}$ is the refractive index of the anti-reflection film n (n=1, 2, or 4) and k is 1, 2, ...

When relations between the refractive index of the glass substrate 1 and those of the first, the second and the fourth anti-reflection films 3, 4 and 6 are opposite to as they are in the first embodiment, the refractive indexes of the anti-reflection films 3, 4 and 6 each may be determined such that the film thickness $d_{an}$ (n=1, 2, or 4) of each anti-reflection film satisfies Eq. 6 below:

$$n_{an} \cdot d_{an} = 2k \cdot \lambda/4 \qquad (6)$$

where $n_{an}$ is the refractive index of the anti-reflection film n (n=1, 2, or 4) and k is 1, 2, ...

Needless to say, the refractive index of the third anti-reflection film 5 is smaller than that of the light shielding pattern 2 in either case, which is similar to the first embodiment. Hence, the film thickness of the third anti-reflection film 5 usually satisfies Eq. 5.

In any case, what is required in determining the thicknesses of the anti-reflection films is merely that a light beam entering the anti-reflection film from an interface of one side and then reflected at the other side interface toward the one side interface once again has, at the one side interface, a phase which is shifted by half the wavelength thereof from the phase of a light beam which is reflected at the one side interface without entering the one side interface.

Although the anti-reflection films are made of magnesium difluoride or chromium oxide in the first embodiment, other transparent materials may be used instead.

Now, a method of manufacturing the photomask of FIG. 4 will be described while referring to FIGS. 6A to 6D. In the manufacturing method, the anti-reflection films are formed by a conventional technique such as light beam exposure.

Figure 6A:
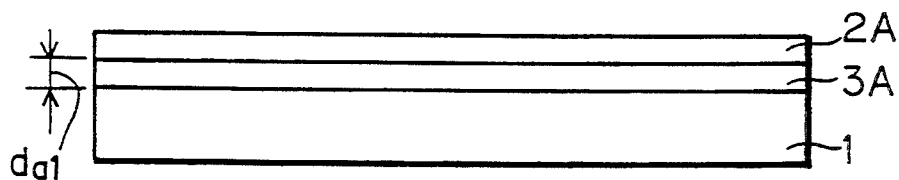
FIGS. 6A to 6D are an explanatory diagram explaining a method of manufacturing the photomask of FIG. 4.

First, a film material layer 3A made of chromium oxide is deposited on the front surface of the glass substrate 1, as shown in FIG. 6A, followed by deposition of a light shielding layer 2A made of chromium on the film material layer 3A. The film material layer 3A has a thickness da1 in such a manner that Eq. 3 is satisfied where $n_{a1}$ is the refractive index of the chromium oxide.

$$n_{a1} \cdot d_{a1} = \lambda/4 \qquad (3)$$

Figure 6B:
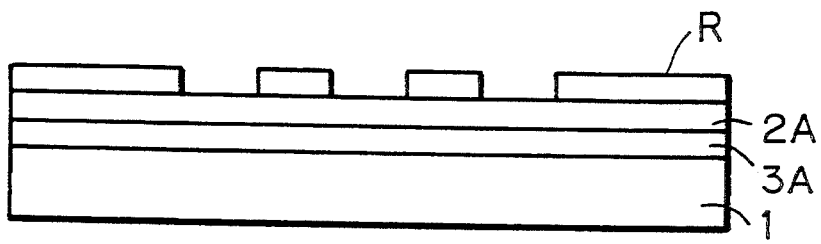

Next, a resist pattern R is formed on the light shielding layer 2A as shown in FIG. 6B.

Figure 6C:
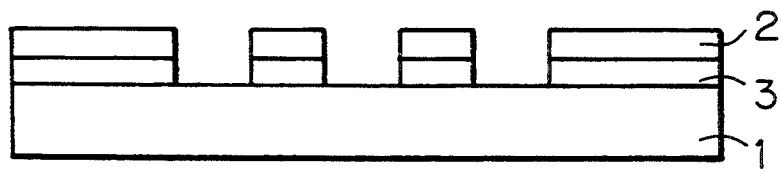

Now, the light shielding layer 2A made of chromium and the film material layer 3A made of chromium oxide are selectively etched by using the resist pattern R, after which the resist pattern R is removed. Thus, the first anti-reflection film 3 made of chromium oxide is completed on the glass substrate 1 and the light shielding pattern 2 made of chromium is completed on the first anti-reflection film 3 (FIG. 6C).

Figure 6D:
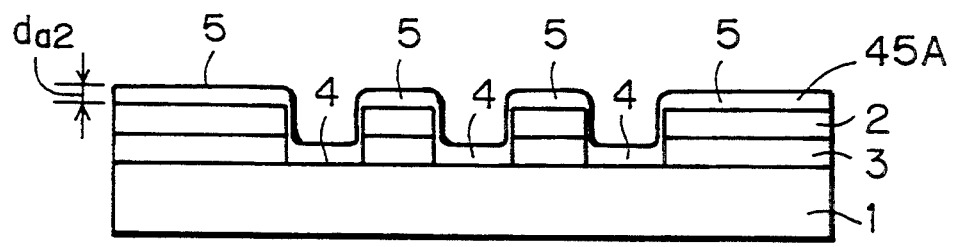

A film material layer 45A made of magnesium difluoride is then deposited on the front surface of the glass substrate 1, on which the light shielding pattern 2 and the first anti-reflection film 3 are provided, as shown in FIG. 6D. The film material layer 45A must be deposited such that the thickness $d_{a2}$ of the film material layer 45A satisfies Eq. 4 where $n_{a2}$ is the refractive index of the magnesium difluoride.

$$n_{a2} \cdot d_{a2} = \lambda/4 \qquad (4)$$

Out of the film material layer 45A formed in such a manner, a portion abutting on the glass substrate 1 acts as the second anti-reflection film 4 and a position on the light shielding pattern 2 acts as the third anti-reflection film 5.

The photomask of FIG. 4 is finished by providing the back surface of the glass substrate 1 with the fourth anti-reflection film 6 made of the same magnesium difluoride as forms the film material layer 45A, the thickness of the fourth anti-reflection film 6 being equal to the thicknesses of the second and the third anti-reflection films 4 and 5.

Figure 7:
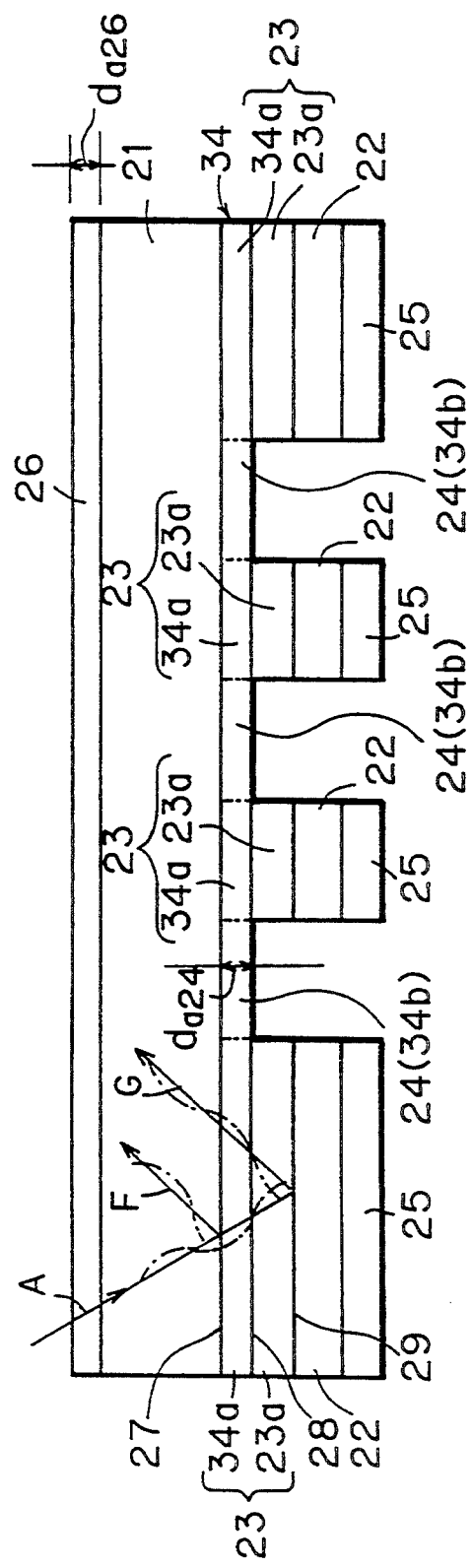
FIG. 7 is a cross sectional view of a photomask according to a second embodiment of the present invention.

FIG. 7 is a diagram of a photomask according to a second embodiment of the present invention. The photomask comprises a light shielding pattern 22 formed on a front surface of a glass substrate 21, too.

In the second embodiment, the front surface of a glass substrate 21 is entirely covered with an anti-reflection film layer 34 made of magnesium difluoride. Between the light shielding pattern 22 and the anti-reflection film layer 34, an anti-reflection film layer 23a made of chromium oxide is inserted. On the surface of the light shielding pattern 22, a third anti-reflection film 25 similarly made of chromium oxide is formed. As readily understood from the above, the anti-reflection film layer 34 and the anti-reflection film layer 23a are inserted between the glass substrate 21 and the light shielding pattern 22. In other words, a first region 34a of the anti-reflection film layer 34 and the anti-reflection film layer 23a overlaying each other constitute a first anti-reflection film 23. A second anti-reflection film layer 24 is formed by a portion of the anti-reflection film layer 34 which does not form the first anti-reflection film 23, that is, a second region 34b exposed between adjacent light shielding patterns 22.

The photomask according to the second embodiment promises approximately the same reflection restraint effects as those obtainable by the photomask according to the first embodiment. The second, the third and the fourth anti-reflection films 24, 25 and 26 each exhibit exactly the same function as explained with respect to FIG. 4. Although the third anti-reflection film 25 is made of chromium, which is different from the first embodiment wherein the third anti-reflection film 5 is made of magnesium difluoride, this does not mean in any regard that the two anti-reflection films function on the surface of the light shielding patterns in a different manner.

As mentioned above, the first anti-reflection film 23 is formed by the first region 34a of the anti-reflection film layer 34 and the anti-reflection film layer 23a. This is also where the photomask of the second embodiment differs from that of the first embodiment. However, an effect remains the same that the first anti-reflection film 23 restrains the light shielding pattern 22 from reflecting a light beam penetrating the glass substrate 21. As shown in FIG. 7, an incident light beam A within the glass substrate 21 toward the light shielding pattern 22 is partially reflected at an interface 27 between the glass substrate 21 and the first anti-reflection film 23 and becomes a reflected light beam F. Since the anti-reflection film layer 34 is made of magnesium difluoride the refractive index of which is smaller than that of the glass substrate 21, an incident light beam A is reflected at the interface 27 without being phase shifted (FIG. 7). An incident light beam entering the first anti-reflection film 23 is partially reflected at an interface 28 between the first region 34a of the anti-reflection film layer 34 and the anti-reflection film layer 23a. An incident light beam further entering the anti-reflection film layer 23a is reflected at an interface 29 between the first anti-reflection film 23 and the light shielding pattern 22. Although reflection does occur at the interface 28 between the first region 34a of the anti-reflection film layer 34 and the anti-reflection film layer 23a, the reflectance of the interface 28 is extremely small. Hence, the quantity of a light beam reflected at the interface 28 is practically negligible. On the contrary, a light beam is phase shifted by $\lambda/2$ in terms of an optical path length when reflected at the interface 29 since the refractive index of the light shielding pattern 22 is larger than that of the first anti-reflection film 23. On the other hand, the thickness of the first anti-reflection film 23 as a whole is $\lambda/2$ in terms of an optical path length due to a fact that the anti-reflection film layer 34 and the anti-reflection film layer 23a each have thickness of $\lambda/4$ in terms of an optical path length. This allows that phase of a light beam entering the first anti-reflection film 23 is led by $\lambda$, or a wavelength in terms of an optical path length while it travels from the interface 27 to the interface 29 and back again to the interface 27. As a result, in the glass substrate 21, the reflected light beam F reflected at the interface 27 and a reflected light beam H reflected at the interface 29 are phase shifted from each other by $\lambda/2$ in terms of an optical path length. In other words, the reflected light beam F weakens the reflected light beam H, whereby reflection by the light shielding pattern 22 is restrained.

The second embodiment requires that the thickness of the first anti-reflection film 23 as a whole is $\lambda/2$ in terms of an optical path length. However, when the refractive index of the anti-reflection film layer 34 is smaller than that of the glass substrate 21 and the refractive index of the anti-reflection film layer 23a is smaller than that of the light shielding pattern 22, the thickness of the first anti-reflection film 23 may be so determined that $2k\cdot\lambda/4$ in terms of an optical path length is satisfied where k is 1, 2, ...

On the other hand, when the refractive index of the anti-reflection film layer 34 is larger than that of the glass substrate 21 and the refractive index of the anti-reflection film layer 23a is smaller than that of the light shielding pattern 22, the thickness of the first anti-reflection film 23 may be so determined that $(2k-1)\cdot\lambda/4$ in terms of an optical path length is satisfied where k is 1, 2, ... For the same reason as described in relation to the first embodiment, the thicknesses $d_{a24}$ and $d_{a26}$ of the second and the fourth anti-reflection films 24 and 26 may be so determined that Eqs. 5 and 6 (with n=24, 26) are satisfied, respectively.

Now, a method of manufacturing the photomask of FIG. 7 according to the second embodiment is explained while referring to FIGS. 8A to 8D.

Figure 8A:
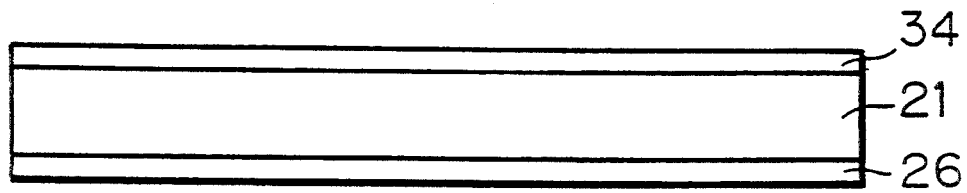
FIGS. 8A to 8D are an explanatory diagram explaining a method of manufacturing the photomask of FIG. 7.

First, the anti-reflection film layer 34 and the fourth anti-reflection film 26 made of magnesium difluoride are disposed on the both sides of the glass substrate 21 as shown in FIG. 8A.

Figure 8B:
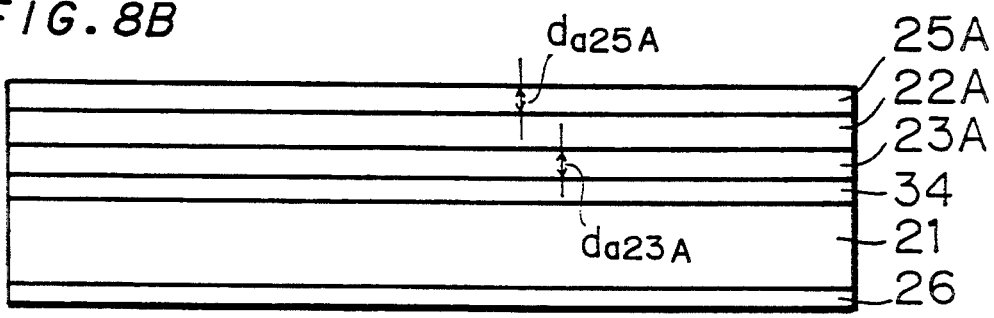

Next, film material layers 23A, 22A and 25A are formed in that order on the anti-reflection film layer 34, the film material layers 23A and 25A being made of chromium oxide and the film material layer 22A being made of chromium (FIG. 8B). The thicknesses $d_{a23A}$ and $d_{25A}$ of the film material layers 23A and 25A are each determined so as to be as the same as a thickness $d_{a1}$ yielded from Eq. 3.

$$n_{a1} \cdot d_{a1} = \lambda/4 \qquad (3)$$

Figure 8C:
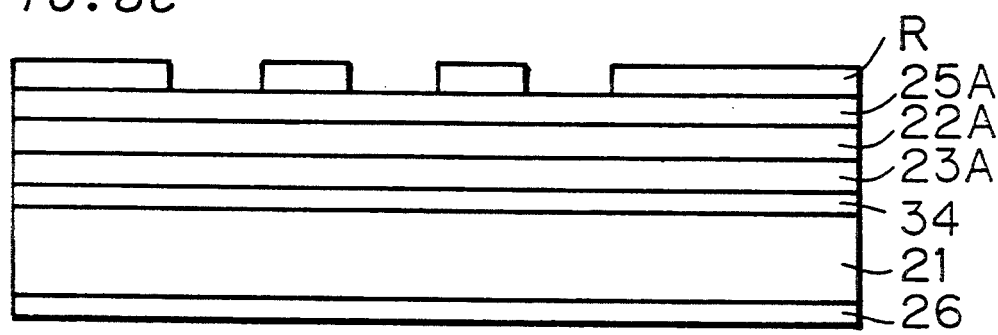

Then, a resist pattern R is formed on the film material layer 25A as shown in FIG. 8C.

Figure 8D:
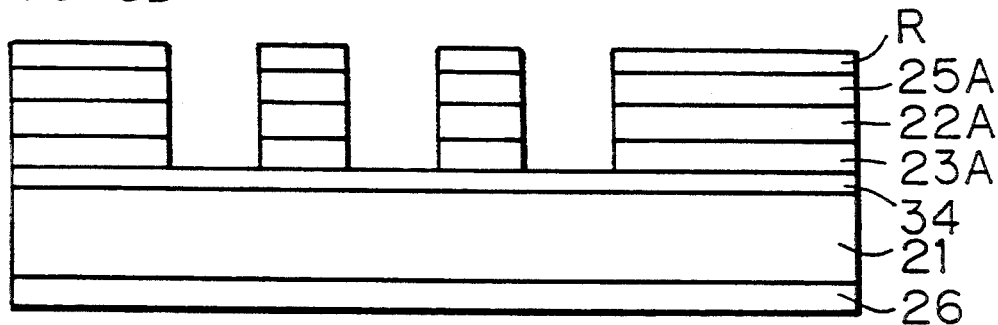

Thereafter, the film material layer 23A of chromium oxide, the film material layer 22A of chromium and the film material layer 25A of chromium oxide are selectively etched by using the resist pattern R as a mask as shown in FIG. 8D. In the selective etching, the second anti-reflection film layer 34 made of magnesium difluoride remains unremoved. Hence, the photomask of FIG. 7 is completed by removing the resist pattern R.

The anti-reflection films are made of magnesium difluoride or chromium oxide in the second embodiment. However, other transparent materials may be used instead.

Although both the first and the second embodiments require that a glass substrate is used as a transparent substrate, the transparent substrate may be made of other transparent materials other than glass material.

While the invention has been shown and described in detail, the foregoing description is in all aspects illustrative and not restrictive. It is understood that numerous modifications and variations can be devised without departing from the scope of the invention.

I claim:

1. A photomask formed by a transparent substrate and a light shielding pattern including a plurality of adjacent regions provided on a front surface side of said transparent substrate, comprising:

a first anti-reflection film formed between said transparent substrate and said light shielding pattern, said first anti-reflection film only being located between said transparent substrate and said light shielding pattern; and a second anti-reflection film formed on the front surface of said transparent substrate between said adjacent regions of said light shielding pattern;

a thickness of said first anti-reflection film being so determined that a phase of a first light beam and a phase of a second light beam are phase shifted by a half wavelength of said first and second light beams at a back surface of said first anti-reflection film, said first light beam being a light beam entering said first anti-reflection film from the back surface thereof and reflected at an interface between said first anti-reflection film and said light shielding pattern back toward the back surface of said first anti-reflection film and said second light beam being a light beam reflected at the back surface of said first anti-reflection film without entering said first anti-reflection film;

a thickness of said second anti-reflection film being so determined that a phase of a third light beam and a phase of a fourth light beam are phase shifted by a half wavelength of said third and fourth light beams at the back surface of said second anti-reflection film, said third light beam being a light beam entering said second anti-reflection film from the back surface thereof and hitting the back surface of said second anti-reflection film once again by being reflected at a front surface of said second anti-reflection film and said fourth light beam being a light beam reflected at the back surface of said second anti-reflection film without entering said second anti-reflection film.

2. A method of manufacturing a photomask including a transparent substrate and a light shielding pattern, comprising the steps of:

forming a first anti-reflection film material layer on a front surface of a transparent substrate, a thickness of said first anti-reflection film being so determined that a phase of a first light beam and a phase of a second light beam are phase shifted by a half wavelength of said first and second light beams at a back surface of said first anti-reflection film, said first light beam entering said first anti-reflection film from the back surface thereof and reflected at an interface between said first anti-reflection film and said light shielding pattern back toward the back surface of said first anti-reflection film and said second light beam being reflected at the back surface of said first anti-reflection film without entering said first anti-reflection film;

forming said light shielding material layer on a front surface of said first anti-reflection film material layer;

selectively etching said first anti-reflection film material layer and said light shielding material layer corresponding to a desired light shielding pattern;

forming a second anti-reflection film on the front surface of said transparent substrate exposed by said etching, a thickness of said second anti-reflection film being so determined that a phase of a third light beam and a phase of a fourth light beam are phase shifted by a half wavelength of said third and fourth light beams at the back surface of said second anti-reflection film, said third light beam entering said second anti-reflection film from the back surface thereof and hitting the back surface of said second anti-reflection film once again by being reflected at a front surface of said second anti-reflection film and said fourth beam being reflected at the back surface of said second anti-reflection film without entering said second anti-reflection film; and forming a third anti-reflection film on a front surface of said light shielding pattern.

3. A method of manufacturing a photomask in accordance with claim 2, wherein said light shielding material layer is made of chromium and said first anti-reflection film material layer is made of chromium oxide.

4. A method of manufacturing a photomask in accordance with claim 2 further comprising a step of forming a fourth anti-reflection film on a back surface of said transparent substrate after said etching.

5. A method of manufacturing a photomask including a transparent substrate and a light shielding pattern comprising the steps of:

forming a first anti-reflection film material layer on a front surface of a transparent substrate, a thickness of said first anti-reflection film being so determined that a phase of a first light beam and a phase of a second light beam are phase shifted by a half wavelength of said first and second light beams at a back surface of said first anti-reflection film, said first light beam entering said first anti-reflection film from the back surface thereof and reflected at an interface between said first anti-reflection film and said light shielding pattern back toward the back surface of said first anti-reflection film and said second light beam being reflected at the back surface of said first anti-reflection film without entering said first anti-reflection film;

forming a second anti-reflection film material layer on a front surface of said first anti-reflection film material layer, a thickness of said second anti-reflection film being so determined that a phase of a third light beam and a phase of a fourth light beam are phase shifted by a half wavelength of said third and fourth light beams at the back surface of said second anti-reflection film, said third light beam entering said second anti-reflection film from the back surface thereof and hitting the back surface of said second anti-reflection film once again by being reflected at a front surface of said second anti-reflection film and said fourth light beam being reflected at the back surface of said second anti-reflection film without entering said second anti-reflection film;

forming said light shielding material layer on a front surface of said second anti-reflection film material layer;

forming a third anti-reflection film material layer on a front surface of said light shielding material layer; and selectively etching said third anti-reflection film material layer, said light shielding material layer and said second anti-reflection film material layer corresponding to a desired light shielding pattern.

6. A method of manufacturing a photomask in accordance with claim 5, wherein said light shielding material layer is made of chromium, said second and third anti-reflection film material layers are made of chromium oxide and said first anti-reflection film material layer is made of magnesium difluoride.

7. A method of manufacturing a photomask in accordance with claim 5 further comprising a step of forming a fourth anti-reflection film on the back surface of said transparent substrate.

8. A photomask which has a light shielding pattern including a plurality of adjacent regions selectively provided on a front surface side of a transparent substrate, a first anti-reflection film formed between said transparent substrate and said light shielding pattern, said first anti-reflection film only being located between aid transparent substrate and said light shielding pattern, a second anti-reflection film formed on a front surface of said light shielding pattern, and a transparent film formed on the front surface of said transparent substrate between said adjacent regions of said light shielding pattern;

characterized in that a thickness of said transparent film is so determined as to satisfy an anti-reflection condition.

9. A photomask in accordance with claim 8 wherein said second anti-reflection film and said third anti-reflection film are made of same material.

10. A photomask in accordance with claim 8, further comprising a fourth anti-reflection film formed on the back surface of said transparent substrate, a thickness of said fourth anti-reflection film being so determined that a phase of a seventh light beam and a phase of a eighth light beam are phase shifted by half wavelength of said seventh and eighth light beams at the back surface of said fourth anti-reflection film, said seventh light beam being a light beam entering said fourth anti-reflection film from a back surface thereof and reflected at an interface between said fourth anti-reflection film and said transparent substrate rate back toward the back surface of said fourth anti-reflection film and said eighth light beam being a light beam reflected at the back surface of said fourth anti-reflection film without entering said fourth anti-reflection film.

11. A photomask in accordance with claim 8, wherein a refractive index of said first anti-reflection film is inbetween a refractive index of said transparent substrate and a refractive index of said light shielding pattern and thickness $d_a$ of said first anti-reflective film is expressed as:

$$n_a \cdot d_a = \lambda/4$$

where $n_a$ is the refractive index of said first anti-reflection film and $\lambda$ is a wavelength of a light beam in air.

12. A method of manufacturing a photomask including a transparent substrate and a light shielding pattern comprising the steps of:

forming a first anti-reflection film material layer on a front surface of a transparent substrate, a thickness of said first anti-reflection film being so determined that a phase of a first light beam and a phase of a second light beam are phase shifted by a half wavelength of said first and second light beams at a back surface of said first anti-reflection film, said first light beam entering said first anti-reflection film from the back surface thereof and hitting the back surface of said anti-reflection film once again by being reflected at a front surface of said first anti-reflection film and said second light beam being reflected at the back surface of said first anti-reflection film without entering said first anti-reflection film;

forming a second anti-reflection film material layer on a front surface of said first anti-reflection film material layer, a thickness of said second anti-reflection film being so determined that a phase of a third light beam and a phase of a fourth light beam are phase shifted by a half wavelength of said third and fourth light beams at a back surface of said first anti-reflection film, said third light beam entering said second anti-reflection film through said first anti-reflection film from the back surface of said first anti-reflection film and hitting the back surface of said first anti-reflection film once again by being reflected at an interface between said second anti-reflection film and said light shielding pattern back toward the back surface of said first anti-reflection film and said fourth light beam being reflected at the back surface of said first anti-reflection film without entering said first anti-reflection film;

forming said light shielding material layer on a front surface of said second anti-reflection film material layer;

forming a third anti-reflection film material layer on a front surface of said light shielding material layer; and selectively etching said third anti-reflection film material layer, said light shielding material layer and said second anti-reflection film material layer corresponding to a desired light shielding pattern.

* * * * *